United States Patent
Zhao et al.

(10) Patent No.: US 11,085,795 B2
(45) Date of Patent: Aug. 10, 2021

(54) ROTARY POSITION SENSOR WITH PLURALITY MAGNET ARRANGEMENT

(71) Applicant: Hamlin Electronics (Suzhou) Ltd., Jiangsu (CN)

(72) Inventors: Jianfei Zhao, Suzhou (CN); Seong-Jae Lee, Suzhou (CN); Wei Zhou, Suzhou (CN)

(73) Assignee: HAMLIN ELECTRONICS (SUZHOU) LTD., Suzhou (CN)

( * ) Notice: Subject to any disclaimer, the term of this patent is extended or adjusted under 35 U.S.C. 154(b) by 175 days.

(21) Appl. No.: 16/465,938

(22) PCT Filed: Dec. 2, 2016

(86) PCT No.: PCT/CN2016/108396
§ 371 (c)(1),
(2) Date: May 31, 2019

(87) PCT Pub. No.: WO2018/098813
PCT Pub. Date: Jun. 7, 2018

(65) Prior Publication Data
US 2020/0072641 A1     Mar. 5, 2020

(51) Int. Cl.
*G01D 5/14*     (2006.01)
*H02K 11/215*     (2016.01)
(Continued)

(52) U.S. Cl.
CPC .......... *G01D 5/145* (2013.01); *G01D 11/245* (2013.01); *G01R 33/07* (2013.01); *H02K 1/06* (2013.01);
(Continued)

(58) Field of Classification Search
CPC .... G01D 5/145; G01D 11/245; H02K 11/215; H02K 1/06; H02K 29/08; G01R 33/07; F02D 2200/602; G01B 7/30; G01L 5/221
(Continued)

(56) References Cited

U.S. PATENT DOCUMENTS 6,542,088 B1    4/2003  Bielski et al.
7,230,419 B2 *  6/2007  Godoy .................. G01D 5/145
                                                324/207.2

(Continued)

FOREIGN PATENT DOCUMENTS

CN    101691107 A    4/2010
CN    101722986 A    6/2010
(Continued)

OTHER PUBLICATIONS

Extended European Search Report dated Jul. 8, 2020 for corresponding European Patent Application No. 16922726.1.
(Continued)

*Primary Examiner* — Giovanni Astacio-Oquendo
(74) *Attorney, Agent, or Firm* — Kacvinsky Daisak Bluni PLLC

(57) ABSTRACT

A disclosed rotary position sensor may include a sensor housing defining an interior cavity. A first rotor may be positioned and rotatable within the interior cavity, the first rotor including a first magnet. Furthermore, the rotary position sensor may include a second rotor positioned and rotatable within the interior cavity, the second rotor including a second magnet. The first rotor and the second rotor may be individually rotatable.

12 Claims, 5 Drawing Sheets

(51) Int. Cl.
*G01D 11/24* (2006.01)
*G01R 33/07* (2006.01)
*H02K 1/06* (2006.01)
*H02K 29/08* (2006.01)

(52) U.S. Cl.
CPC .......... *H02K 11/215* (2016.01); *H02K 29/08* (2013.01); *F02D 2200/602* (2013.01)

(58) Field of Classification Search
USPC ............... 324/207.25, 207.13, 207.11, 200
See application file for complete search history.

(56) References Cited

U.S. PATENT DOCUMENTS

| | | | | |
|---|---|---|---|---|
| 7,382,120 | B2* | 6/2008 | Narasimhan | G01D 5/145 |
| | | | | 324/207.2 |
| 7,816,881 | B2* | 10/2010 | Wiegers | H02P 6/16 |
| | | | | 318/638 |
| 2002/0093360 | A1* | 7/2002 | Nagata | G01R 31/2884 |
| | | | | 361/86 |
| 2003/0218458 | A1 | 11/2003 | Seger et al. | |
| 2005/0075828 | A1* | 4/2005 | Sakabe | G01D 5/145 |
| | | | | 702/151 |
| 2009/0267594 | A1* | 10/2009 | Kather | G01B 7/30 |
| | | | | 324/207.25 |
| 2010/0060267 | A1 | 3/2010 | Wagner | |
| 2011/0080162 | A1 | 4/2011 | Steinich et al. | |
| 2011/0128102 | A1* | 6/2011 | Pfeiffer | H01H 36/0073 |
| | | | | 335/206 |
| 2015/0028856 | A1 | 1/2015 | Putinier | |
| 2015/0028858 | A1* | 1/2015 | Putinier | G01D 5/145 |
| | | | | 324/207.14 |
| 2015/0293185 | A1* | 10/2015 | Kaufmann | G01D 3/0365 |
| | | | | 324/225 |

FOREIGN PATENT DOCUMENTS

| | | | | |
|---|---|---|---|---|
| CN | 105593645 A | | 5/2016 | |
| WO | WO-2018053793 A1 | * | 3/2018 | ........... G01D 11/245 |

OTHER PUBLICATIONS

International Search Report from PCT/CN2016/108396 dated Sep. 7, 2017, 13 pages.
Written Opinion from PCT/CN2016/108396 dated Sep. 7, 2017, 4 pages.

* cited by examiner

ROTARY POSITION SENSOR WITH PLURALITY MAGNET ARRANGEMENT

BACKGROUND

Field

The present disclosure generally relates to sensors. In particular, the present disclosure relates to rotary position sensors for sensing the position of controls in vehicular systems.

Description of Related Art

Rotary position sensors may be used in vehicles to sense the position of accelerator pedals, clutch pedals, brake pedals, throttle bodies, and other such controls in vehicular systems. Conventional rotary position sensors may use formed magnets to direct magnetic flux to one or more magnet-effect sensors (e.g., Hall-effect, Anisotropic Magneto-Resistive sensors, Giant magnetoresistance, and Tunnel magnetoresistance sensors) to enable position sensing of various controls in vehicular systems.

Conventional rotary position sensors are functional to sense the position of a single control in a vehicular system (e.g., a single accelerator pedal or a single brake pedal). Therefore, a single conventional rotary position sensor is not capable of providing position information related to a plurality of vehicular controls that are in close proximity. More specifically, a conventional rotary position sensor must be associated with each vehicular control (e.g., accelerator pedal, clutch pedal, and brake pedal). Therefore, there is a need to provide a rotary position sensor that is capable of providing position information associated with a plurality of vehicular controls that are in close proximity.

Additionally, conventional rotary position sensors are costly to manufacture because such conventional rotary position sensors generally require a shaped magnet. In addition, conventional rotary position sensors a lack operational redundancy. Therefore, there is a need to provide a rotary position sensor that is inexpensive to manufacture and that includes rotary position operational redundancy.

Other problems with existing rotary position sensors will become apparent in view of the disclosure below.

SUMMARY

This Summary is provided to introduce a selection of concepts in a simplified form further described below in the Detailed Description. This Summary is not intended to identify key or essential features of the claimed subject matter, nor is this Summary intended as an aid in determining the scope of the claimed subject matter.

According to one implementation of an apparatus, the apparatus may include a rotary position sensor housing. A first rotor may be disposed in the rotary position sensor housing, the first rotor including a first magnet coupled thereto. Furthermore, a second rotor may be disposed in the rotary position sensor housing, the second rotor including a second magnet coupled thereto. The apparatus may further include first and second sensors disposed adjacent to the first magnet, and third and fourth sensors disposed adjacent to the second magnet.

According to another implementation of an apparatus, the apparatus may include a rotary position sensor housing. The apparatus may further include a first rotor disposed in the rotary position sensor housing, the first rotor including a plurality of magnets coupled thereto. Furthermore, the apparatus may include a first sensor disposed adjacent to one of the plurality of magnets coupled to the first rotor.

DETAILED DESCRIPTION

Rotary position sensors are disclosed. In one implementation, a rotary position sensor includes a sensor housing. Two rotors may be disposed in the sensor housing. Each of the two rotors may be individually rotatable within the sensor housing, and each of the two rotors may include one or more magnets. In one implementation, the one or more magnets are not shaped. Specifically, each of the one or more magnets may be a simple square or rectangle magnet. Use of simple square or rectangle magnets reduces the manufacturing costs associated with the rotary position sensor, compared to the manufacturing costs associated with conventional rotary position sensors.

Figure 1:
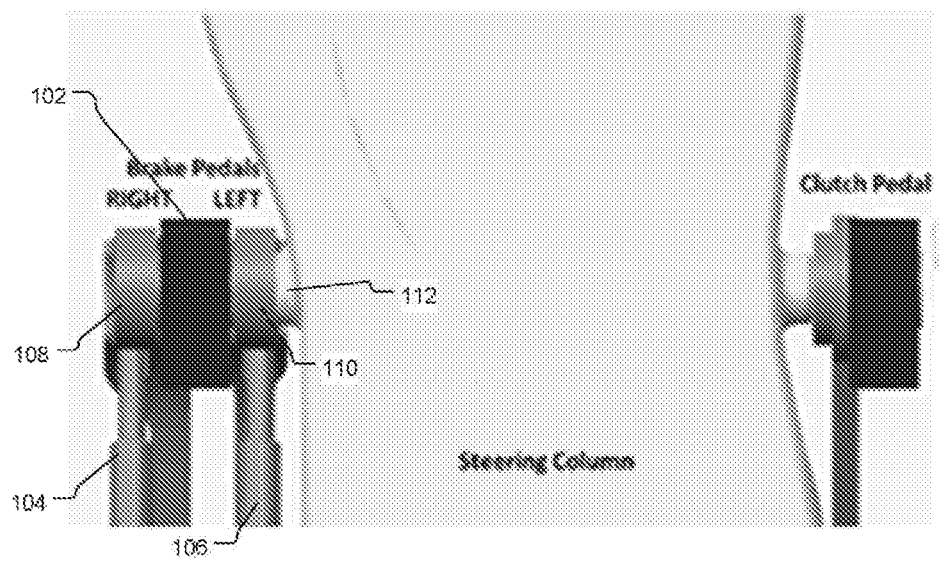
FIG. 1 illustrates an example use of a rotary position sensor that includes two rotary position sensors in one housing, according to an exemplary implementation.

FIG. 1 illustrates an example use of a rotary position sensor 102 that includes two rotary position sensors in one housing. As is illustrated, the rotary position sensor 102 is coupled between a first brake pedal arm 104 that corresponds to a first brake pedal and a second brake pedal arm 106 that corresponds to a second brake pedal. A shaft 112 may extend at least through a bore or hole associated with the rotary position sensor 102. The first brake pedal arm 104 includes a flared brake arm portion 108 that is caused to rotate when the first brake pedal is engaged. The flared brake arm portion 108 is coupled to a first of the two rotary position sensors of the rotary position sensor 102. The second brake pedal arm 106 includes a flared brake arm portion 110 that is caused to rotate when the second brake pedal is actuated. The flared brake arm portion 110 is coupled to a second of the two rotary position sensors of the rotary position sensor 102.

Although FIG. 1 illustrates use of the rotary position sensor 102 in relation to a first brake pedal arm 104 and a second pedal arm 106, this is a non-limiting example. Specifically, the rotary position sensor 102 may be positioned between other rotatable elements, such as rotatable elements associated with clutches, throttle bodies, and the like.

Figure 2:
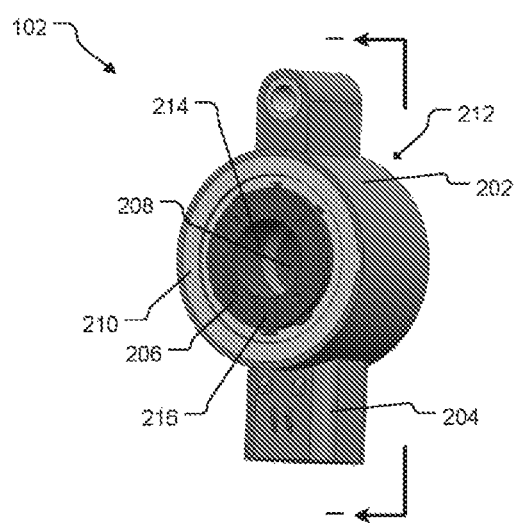
FIG. 2 illustrates a perspective view of the rotary position sensor, according to an exemplary implementation.

FIG. 2 illustrates a perspective view of the rotary position sensor 102. The rotary position sensor 102 includes a rotary position sensor housing or sensor housing 202. The sensor housing 202 includes a plug portion 204 that enables connection of the rotary position sensor 102 to an electronic control unit or other computer or processor. The electronic control unit or other computer processor may be associated with a vehicular system, such as an automobile, agriculture or work machine, or the like.

A first rotor 206 may be disposed in the sensor housing 202. Furthermore, a second rotor 208 may be disposed within the sensor housing 202. Each of the first rotor 206 and the second rotor 208 is independently rotatable. For example, a rotatable element (e.g., the flared brake arm portion 108) may be coupled to the first rotor 206 to thereby cause rotation of the first rotor 206. Furthermore, a separate rotatable element (e.g., the flared brake arm portion 110) may be coupled to the second rotor 208 to thereby cause rotation of the second rotor 208. As is illustrated, a bore or hole 214 is defined through at least the first rotor 206 and the second rotor 208. The bore or hole 214 is to accommodate the shaft 112. The bore or hole 214 is an optional element of the rotary position sensor 102. Furthermore, a notch 216 is disposed on an exterior surface of the first rotor 206. A similar notch is also found on the second rotor 208. The notch 216 is designed to engage with a protrusion or key associated with the flared brake arm portion 108.

In one implementation, the rotary position sensor 102 includes a first cover 210 that is a positioned over at least a portion of the first rotor 206. Similarly, the rotary position sensor 102 includes a second cover 212 that is positioned over at least a portion of the second rotor 208. A view of the second cover 212 is provided in subsequent one or more figures associated with this disclosure.

Figure 3:
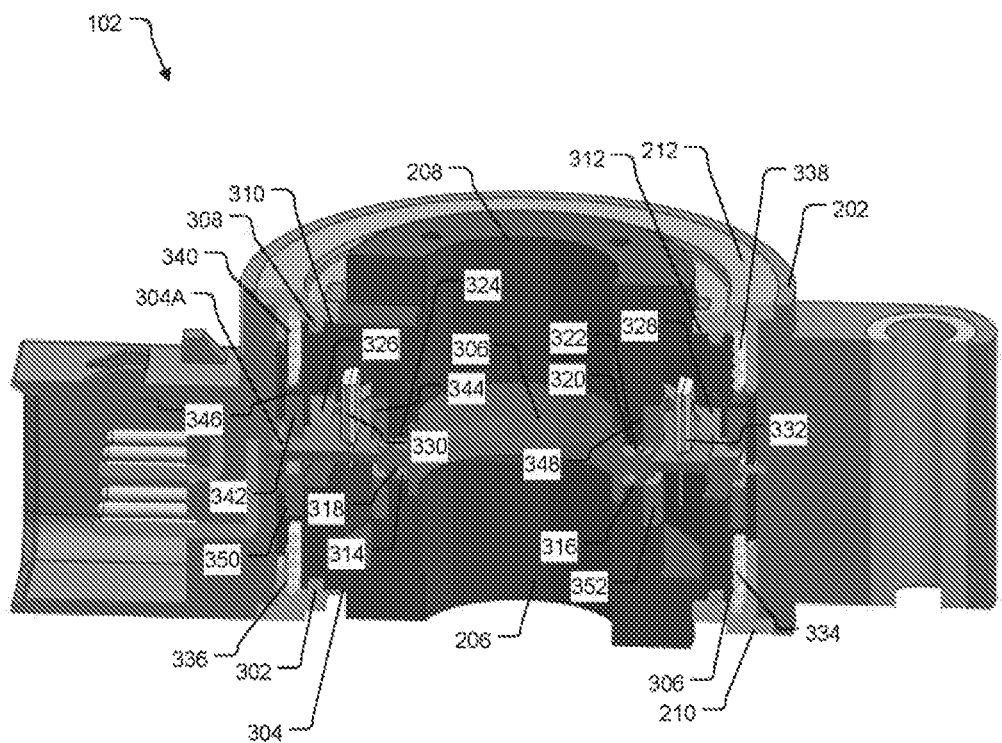
FIG. 3 illustrates a cross-section view of the rotary position sensor, as viewed from the perspective of line I-I shown in FIG. 2, according to an exemplary implementation.

FIG. 3 illustrates a cross-section view of the rotary position sensor 102, as viewed from the perspective of line I-I shown in FIG. 2. As is illustrated, an o-ring 302, made of rubber, may be disposed on a face 304 of the first rotor 206. Therefore, the o-ring 302 is positioned between an interior surface 306 of the first cover 210 and the face 304 of the first rotor 206. The o-ring 302 is provided to mitigate against ingress of water and other external environmental elements, such as dust, chemicals, and the like.

Similarly, an o-ring 308, made of rubber, may be disposed on a face 310 of the second rotor 208. Therefore, the o-ring 308 is positioned between an interior surface 312 of the second cover 212 and the face 310 of the second rotor 208. The o-ring 308 is provided to mitigate against ingress of water and other external environmental elements, such as dust, chemicals, and the like.

As is shown, the rotary position sensor 102 includes a ring element 304A disposed within an interior cavity of the rotary position sensor 102. The ring element 304A may be made of a ferromagnetic material, such as iron or the like. The ring element 304A functions to provide a magnetic field separation between the first rotor 206 and the second rotor 208. Moreover, the ring element 304A provides a dividing barrier between the first rotor 206 and the second rotor 208, to minimize friction between the first rotor 206 and the second rotor 208.

An o-ring 314 is disposed on a first surface 318 of a center portion 306 associated with the rotary position sensor 102. The o-ring 314 may be made of rubber. The o-ring 314 is positioned between the center portion 306 and an interior surface 316 of the first rotor 206. The o-ring 314 is provided to mitigate against ingress of water and other environmental elements, such as dust, chemicals, and the like. An o-ring 320 is disposed on a second surface 322 of the center portion 306. The o-ring 320 may be made of rubber. The o-ring 320 is positioned between the center portion 306 and an interior surface 324 of the second rotor 208. The o-ring 320 is provided to mitigate against ingress of water and other environmental elements, such as dust, chemicals, and the like.

A magnet 326 may be associated with the second rotor 208. A second magnet 328 may be associated with the second rotor 208. Although not illustrated in FIG. 3, up to four magnets may be associated with the second rotor 208. Similarly, although not illustrated in FIG. 3, up to four magnets may be associated with the first rotor 206. In one implementation, the magnet 326 and the second magnet 328 are simple square or rectangle magnets. Specifically, in one implementation, the magnet 326 and the second magnet 328 are not shaped magnets.

Magnetic field sensors 330 and 332 may be housed within the sensor housing 202 and associated with the second rotor 208. The magnetic field sensors 330 and 332 may be magnet-effect sensors (e.g., Hall-effect, Anisotropic Magneto-Resistive sensors, Giant magnetoresistance, and Tunnel magnetoresistance sensors). Although not illustrated in FIG. 3, magnetic field sensors may be housed within the sensor housing 202 and associated with the first rotor 206.

Shielding rings 342 and 344 may be associated with the second rotor 208. The shielding ring 342 is attached to a groove 346 in the second rotor 208. The shielding ring 344 is coupled to a surface 348 of the second rotor 208. Similarly, shielding rings 350 and 352 may be associated with the first rotor 206. The shielding rings 342, 344, 350 and 352 may be made, at least partially, of ferromagnetic material, such as iron or the like. The shielding rings 342, 344, 350 and 352 may be coupled to the rotors 206 and 208 using an adhesive, molding, mechanical attachment device, such as one or more fasteners, screws or clips, or the like. The shielding rings 342, 344, 350 and 352 are used to substantially isolate magnetic fields within the sensor housing 202. Furthermore, the shielding rings 342, 344, 350 and 352 concentrate the magnetic fields within the sensor housing 202 to improve the linearity of the output signals of the rotary position sensor 102. Furthermore, the shielding rings 342, 344, 350 and 352 are used to mitigate against interference, such as the magnetic field interference, entering the sensor housing 202. In one implementation, the shielding rings 344 and 352 mitigate against magnetic interference that may be caused by the shaft 112, which may be made of ferrous material.

As further illustrated in FIG. 3, a spring 334 is disposed in a slot 336 defined by the first rotor 206 and the first cover 210. The spring 334 is functional to bias the first rotor 206 to a predetermined initial position. Furthermore, a spring 338 is disposed in a slot 340 defined by the second rotor 208 and the second cover 212. The spring 338 is functional to bias the second rotor 208 to a predetermined initial position.

The magnetic field sensor 330 produces an electrical output signal that changes in response to the position of the magnet 326. The position of the magnet 326 will change as the rotor 208 is rotated. As the magnetic field (i.e., magnitude/strength and polarity/direction) generated by the magnet 326 varies with rotation the rotor 208, the electrical output signal produced by the magnetic field sensor 330 changes accordingly, thus allowing the position the rotor 208 to be determined or ascertained and accordingly the position of flared brake arm portion 110 coupled to the rotor 208 to be determined or ascertained. The magnetic field sensor 330 senses the changing magnetic field (i.e., magnitude/strength and polarity/direction) as the magnet 326 is rotated. In one embodiment, the electrical signal produced by the magnetic field sensor 330 is proportional to the position of the flared brake arm portion 110.

Similarly, the magnetic field sensor 332 produces an electrical output signal that changes in response to the position of the magnet 328. The position of the magnet 328 will change as the rotor 208 is rotated. As the magnetic field (i.e., magnitude/strength and polarity/direction) generated by the magnet 328 varies with rotation the rotor 208, the electrical output signal produced by the magnetic field sensor 332 changes accordingly, thus allowing the position the rotor 208 to be determined or ascertained and accordingly the position of flared brake arm portion 110 coupled to the rotor 208 to be determined or ascertained. The magnetic field sensor 332 senses the changing magnetic field (i.e., magnitude/strength and polarity/direction) as the magnet 328 is rotated. In one embodiment, the electrical signal produced by the magnetic field sensor 332 is proportional to the position of the flared brake arm portion 110.

In one implementation, the magnets 326, 328 and magnetic field sensor sensors 330, 332 provide a redundant rotation sensing arrangement for the rotor 208. In particular, the combination of the magnet 326 and the magnetic field sensor 330 provides the same rotation data as the combination of the magnet 328 and the magnetic field sensor 332. This redundant design is particularly advantageous in rotation detection arrangements that should provide robust and failsafe rotation data associated with the rotor 208.

The magnets and field sensors associated with the rotor 206 provide the same functionality as described in relation to magnets 326 and 328 and magnetic field sensors 330 and 332. More particularly, the magnets and field sensors associated with the rotor 206 enable the calculation of position change associated with the rotor 206, as the rotor 206 is rotated. In one implementation, the flared brake arm 108 causes rotation of the rotor 206.

Figure 4:
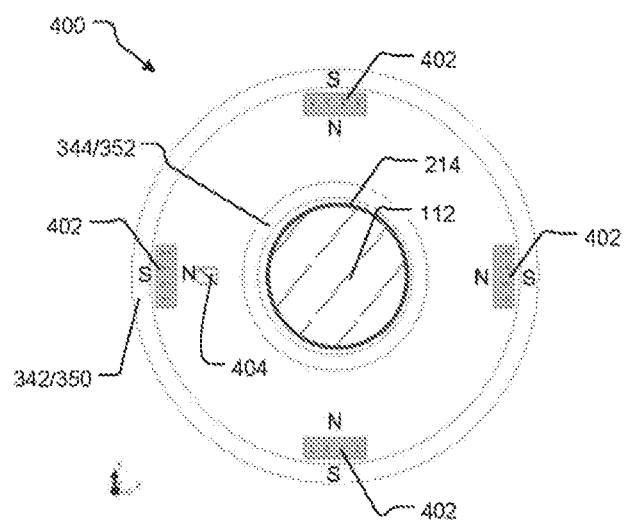
FIG. 4-8 illustrate an arrangements including magnets and sensors, according to exemplary implementations.

FIG. 4 illustrates an arrangement 400 including magnets 402 and a sensor 404 that may be associated with one or both of the rotors 206 and 208 of the rotary position sensor 102. FIG. 4 illustrates the shielding rings 342 or 350 and 344 or 352, to show a relative location of the arrangement 400 within the rotary position sensor housing or sensor housing 202. Furthermore, the shaft 112 and the bore or hole 214 are illustrated to provide further clarity of the relative location of the arrangement 400 within the rotary position sensor housing 202. The sensor 404 is similar or the same as the sensor 330 or 332 illustrated in FIG. 3. Furthermore, the magnets 402 to may be similar or the same as the magnets 326 and 328 illustrated in FIG. 3.

The arrangement 400 allows for rotor rotation determination for rotors 206 and/or 208 in the range of −45°, −90°, −360°, −720°, +45°, +90°, +360°, and/or +720°. In another implementation, the poles of the magnets 402 may be reversed. Furthermore, in another implementation, the magnets 402 may be positioned adjacent to the shielding ring 344 or 352, rather than adjacent to the shielding ring 342 or 350. The foregoing also applies to the arrangements illustrated in FIGS. 5-8. In one implementation, the arrangement 400 is part of the rotor 206. In another implementation, the arrangement 400 is also part of the rotor 208. Although four magnets 402 are illustrated in FIG. 4, the arrangement 400 may be implemented with a single magnet 402, two magnets 402, or three magnets 402.

Figure 5:
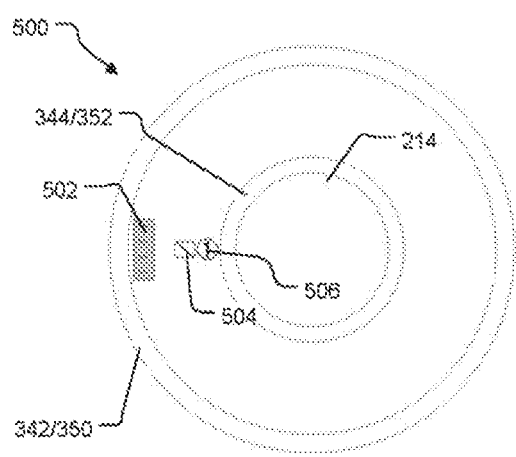

FIG. 5 illustrates an arrangement 500 including a magnet 502 and at least one sensor 504 that may be associated with one or both of the rotors 206 and 208 of the rotary position sensor 102. FIG. 5 illustrates the shielding rings 342 or 350 and 344 or 352, to show a relative location of the arrangement 500 within the rotary position sensor housing or sensor housing 202. Furthermore, the bore or hole 214 is illustrated to provide further clarity of the relative location of the arrangement 500 within the rotary position sensor housing 202. The sensor 504 is similar or the same as the sensor 330 or 332 illustrated in FIG. 3. Furthermore, the magnet 502 to may be similar or the same as the magnets 326 and 328 illustrated in FIG. 3.

In one implementation, a redundant sensor 506 may be placed adjacent to (e.g., behind, in front or, or next to) the sensor 504. The redundant sensor 506 is similar or the same as the sensor 330 or 332 illustrated in FIG. 3. The sensor 506 is to detect the same rotation information as the sensor 504. Therefore, in the event that the sensor 504 fails, the sensor 506 may be used to detect rotation information associated with the rotor 206 or the rotor 208.

Figure 6:
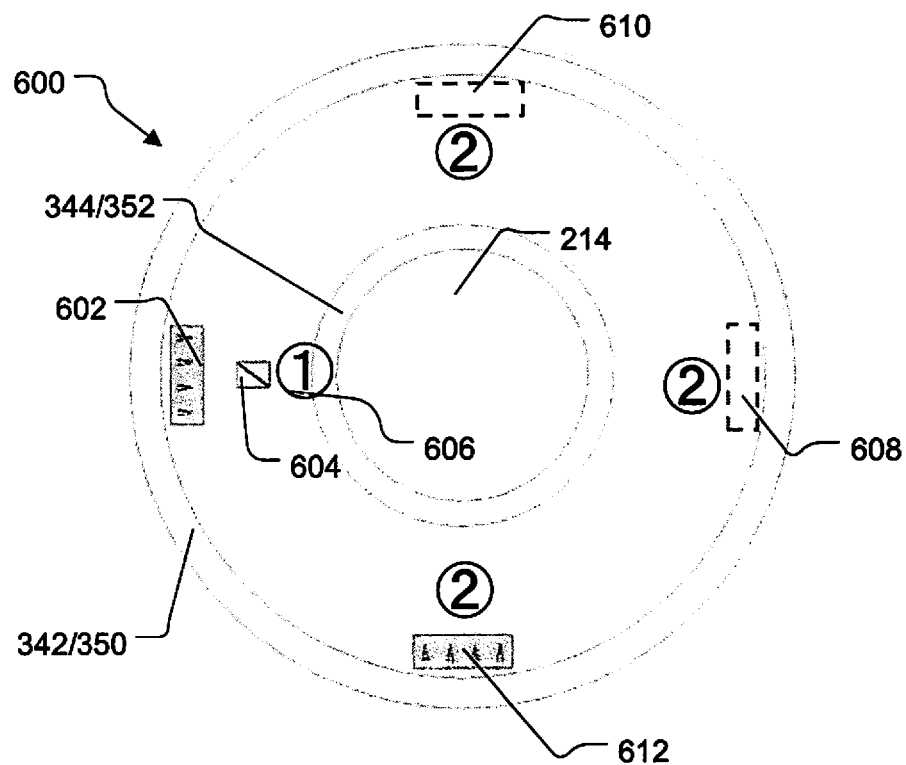

FIG. 6 illustrates an arrangement 600 including a magnet 602 and at least one sensor 604 that may be associated with one or both of the rotors 206 and 208 of the rotary position sensor 102. FIG. 6 illustrates the shielding rings 342 or 350 and 344 or 352, to show a relative location of the arrangement 600 within the rotary position sensor housing or sensor housing 202. Furthermore, the bore or hole 214 is illustrated to provide further clarity of the relative location of the arrangement 600 within the rotary position sensor housing 202. The sensor 604 is similar or the same as the sensor 330 or 332 illustrated in FIG. 3. Furthermore, the magnet 602 may be similar or the same as the magnets 326 and 328 illustrated in FIG. 3.

In one implementation, a redundant sensor 606 may be placed adjacent to (e.g., behind, in front or, or next to) the sensor 604. The redundant sensor 606 is similar or the same as the sensor 330 or 332 illustrated in FIG. 3. The sensor 606 is to detect the same rotation information as the sensor 604. Therefore, in the event that the sensor 604 fails, the sensor 606 may be used to detect rotation information associated with the rotor 206 or the rotor 208.

FIG. 6 further illustrates an additional magnet 612. The additional magnet 612 may be alternatively located at a position 608 or a position 610. Use of the additional magnet 612 enables positioning of the sensor 606 adjacent to the additional magnet 612.

Figure 7:
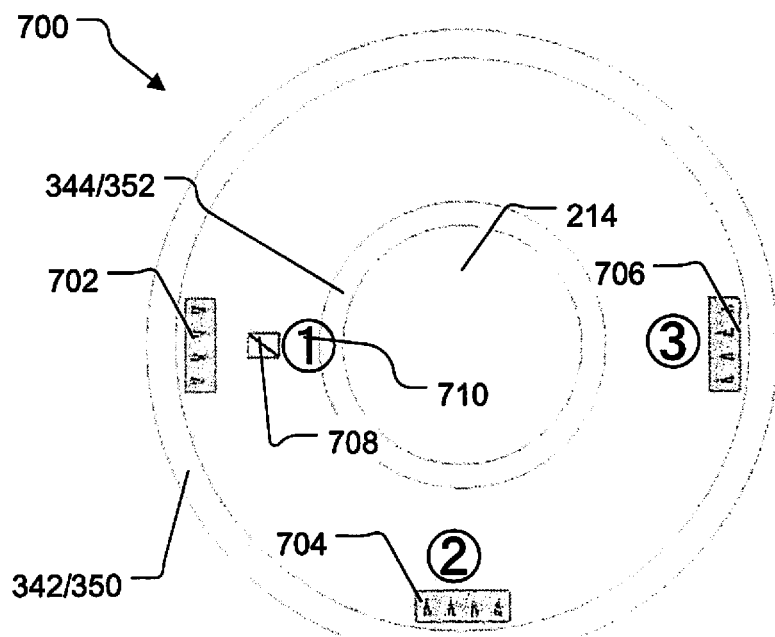

FIG. 7 illustrates an arrangement 700 including a plurality magnets 702, 704 and 706 and at least one sensor 708 that may be associated with one or both of the rotors 206 and 208 of the rotary position sensor 102. FIG. 7 illustrates the shielding rings 342 or 350 and 344 or 352, to show a relative location of the arrangement 700 within the rotary position sensor housing or sensor housing 202. Furthermore, the bore or hole 214 is illustrated to provide further clarity of the relative location of the arrangement 700 within the rotary position sensor housing 202. The sensor 708 is similar or the same as the sensor 330 or 332 illustrated in FIG. 3. Furthermore, the magnets 702, 704 and 706 may be similar or the same as the magnets 326 and 328 illustrated in FIG. 3.

In one implementation, a redundant sensor 710 may be placed adjacent to (e.g., behind, in front or, or next to) the sensor 708. The redundant sensor 710 is similar or the same as the sensor 330 or 332 illustrated in FIG. 3. The sensor 710 is to detect the same rotation information as the sensor 708. Therefore, in the event that the sensor 708 fails, the sensor 710 may be used to detect rotation information associated with the rotor 206 or the rotor 208. Alternatively, the redundant sensor 710 may be implemented adjacent to the magnet 704 or the magnet 706.

Figure 8:
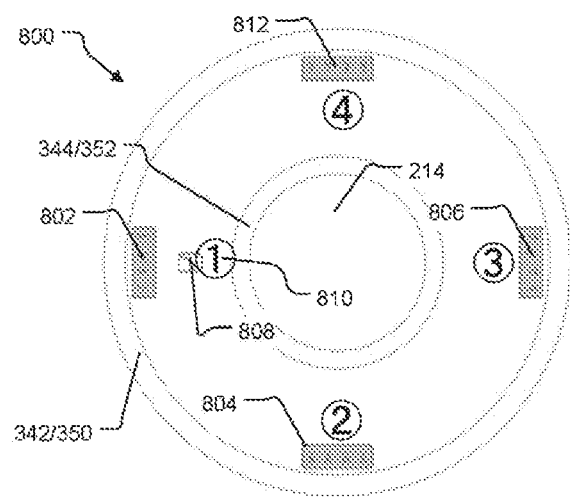

FIG. 8 illustrates an arrangement 800 including a plurality magnets 802, 804, 806 and 812 and at least one sensor 808 that may be associated with one or both of the rotors 206 and 208 of the rotary position sensor 102. FIG. 8 illustrates the shielding rings 342 or 350 and 344 or 352, to show a relative location of the arrangement 800 within the rotary position sensor housing or sensor housing 202. Furthermore, the bore or hole 214 is illustrated to provide further clarity of the relative location of the arrangement 800 within the rotary position sensor housing 202. The sensor 808 is similar or the same as the sensor 330 or 332 illustrated in FIG. 3. Furthermore, the magnets 802, 804, 806 and 812 may be similar or the same as the magnets 326 and 328 illustrated in FIG. 3.

In one implementation, a redundant sensor 810 may be placed adjacent to (e.g., behind, in front or, or next to) the sensor 808. The redundant sensor 810 is similar or the same as the sensor 330 or 332 illustrated in FIG. 3. The sensor 810 is to detect the same rotation information as the sensor 808. Therefore, in the event that the sensor 808 fails, the sensor 810 may be used to detect rotation information associated with the rotor 206 or the rotor 208. Alternatively, the redundant sensor 810 may be implemented adjacent to the magnet 804, magnet 806 or magnet 812. The arrangement 800 allows for rotor rotation determination for rotors 206 and/or 208 in the range of −45°, −90°, −360°, −720°, +45°, +90°, +360°, and/or +720°.

While exemplary rotary position sensors are disclosed, it will be understood by those skilled in the art that various changes may be made and equivalents may be substituted without departing from the spirit and scope of the claims of the application. Other modifications may be made to adapt a particular situation or material to the teachings disclosed above without departing from the scope of the claims. Therefore, the claims should not be construed as being limited to any one of the particular embodiments disclosed, but to any embodiments that fall within the scope of the claims.

We claim:

1. An apparatus, comprising:
a rotary position sensor housing;
a first rotor disposed in the rotary position sensor housing, the first rotor including a first magnet coupled thereto;
a second rotor disposed in the rotary position sensor housing, the second rotor including a second magnet coupled thereto;
a first shielding ring and a second shielding ring coupled to the first rotor, at least the first magnet being disposed between the first shielding ring and the second shielding ring;
first and second sensors disposed adjacent to the first magnet; and
third and fourth sensors disposed adjacent to the second magnet.

2. The apparatus according to claim 1, wherein the first rotor includes at least one additional magnet coupled thereto, and the second rotor includes at least one additional magnet coupled thereto.

3. The apparatus according to claim 1, wherein the first and second sensors detect movement of the first magnet and the third and fourth sensors detect movement of the second magnet.

4. The apparatus according to claim 1, further comprising a third shielding ring and a fourth shielding ring coupled to the second rotor, at least the second magnet being disposed between the third shielding ring and the fourth shielding ring.

5. The apparatus according to claim 1, wherein each of the first magnet and the second magnet is a square or rectangle magnet.

6. An apparatus, comprising:
a rotary position sensor housing;
a first rotor disposed in the rotary position sensor housing, the first rotor including a plurality of magnets coupled thereto;
a first shielding ring and a second shielding ring coupled to the first rotor, at least the plurality of magnets being disposed between the first shielding ring and the second shielding ring; and
a first sensor disposed adjacent to one of the plurality of magnets coupled to the first rotor.

7. The apparatus according to claim 6, further comprising a second rotor disposed in the rotary position sensor housing, the second rotor including another plurality of magnets coupled thereto.

8. The apparatus according to claim 7, wherein a second sensor is disposed adjacent to one of the another plurality of magnets coupled to the second rotor.

9. The apparatus according to claim 8, wherein a third sensor is disposed adjacent to the second sensor.

10. The apparatus according to claim 6, wherein a second sensor is disposed adjacent to the first sensor.

11. The apparatus according to claim 6, wherein the plurality of magnets is two magnets, three magnets or four magnets.

12. The apparatus according to claim 6, wherein each of the plurality of magnets is a square or rectangle magnet.

* * * * *